(12) United States Patent
Shah et al.

(10) Patent No.: US 11,069,514 B2
(45) Date of Patent: Jul. 20, 2021

(54) REMOTE CAPACITIVELY COUPLED PLASMA SOURCE WITH IMPROVED ION BLOCKER

(71) Applicant: Applied Materials, Inc., Santa Clara, CA (US)

(72) Inventors: Vivek B Shah, Sunnyvale, CA (US); Vinayak Vishwanath Hassan, Santa Clara, CA (US); Bhaskar Kumar, Santa Clara, CA (US); Ganesh Balasubramanian, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/523,241

(22) Filed: Jul. 26, 2019

(65) Prior Publication Data

US 2020/0035467 A1   Jan. 30, 2020

Related U.S. Application Data

(60) Provisional application No. 62/711,206, filed on Jul. 27, 2018.

(51) Int. Cl.
| | |
|---|---|
| *C23F 1/00* | (2006.01) |
| *H01L 21/306* | (2006.01) |
| *C23C 16/52* | (2006.01) |
| *C23C 16/458* | (2006.01) |
| *H01J 37/32* | (2006.01) |

(52) U.S. Cl.
CPC .. *H01J 37/32697* (2013.01); *H01J 37/32091* (2013.01); *H01J 37/32449* (2013.01); *H01J 37/32715* (2013.01); *H01J 2237/0262* (2013.01); *H01J 2237/20214* (2013.01); *H01J 2237/20221* (2013.01); *H01J 2237/332* (2013.01)

(58) Field of Classification Search
CPC ........... H01J 37/32036; H01J 37/32541; H01J 37/32422; H01J 37/32357; H01L 21/3065; H01L 21/67069
See application file for complete search history.

(56) References Cited

U.S. PATENT DOCUMENTS

| | | |
|---|---|---|
| 4,158,589 A | 6/1979 | Keller et al. |
| 9,373,517 B2 | 6/2016 | Yang et al. |
| 10,204,795 B2 | 2/2019 | Huang et al. |

(Continued)

FOREIGN PATENT DOCUMENTS

| | | | |
|---|---|---|---|
| WO | 2012142038 A1 | 10/2012 | |
| WO | WO-2012142038 A1 * | 10/2012 | ........... C23C 16/517 |
| WO | 2019/190751 A1 | 10/2019 | |

OTHER PUBLICATIONS

PCT International Search Report and Written Opinion in PCT/US2019/043624 dated Nov. 19, 2019, 18 pages.

*Primary Examiner* — Brian Turner
(74) *Attorney, Agent, or Firm* — Servilla Whitney LLC

(57) ABSTRACT

Apparatus and methods for generating a flow of radicals are provided. An ion blocker is positioned a distance from a faceplate of a remote plasma source. The ion blocker has openings to allow the plasma to flow through. The ion blocker is polarized relative to a showerhead positioned on an opposite side of the ion blocker so that there are substantially no plasma gas ions passing through the showerhead.

19 Claims, 3 Drawing Sheets

(56) References Cited

U.S. PATENT DOCUMENTS

| | | |
|---|---|---|
| 2002/0004309 A1 | 1/2002 | Collins et al. |
| 2005/0067099 A1 | 3/2005 | Walton et al. |
| 2008/0289576 A1 | 11/2008 | Lee et al. |
| 2009/0102022 A1 | 4/2009 | Kim |
| 2009/0269940 A1* | 10/2009 | Honda .............. H01L 21/28202 438/776 |
| 2010/0270262 A1* | 10/2010 | Hanawa ................. G03F 7/427 216/13 |
| 2014/0227881 A1* | 8/2014 | Lubomirsky ........... C23C 16/54 438/710 |
| 2018/0230597 A1 | 8/2018 | Ma et al. |
| 2019/0122860 A1* | 4/2019 | Lee ................... H01J 37/32366 |

* cited by examiner

REMOTE CAPACITIVELY COUPLED PLASMA SOURCE WITH IMPROVED ION BLOCKER

CROSS-REFERENCE TO RELATED APPLICATIONS

This application claims priority to U.S. Provisional Application No. 62/711,206, filed Jul. 27, 2018, the entire disclosure of which is hereby incorporated by reference herein.

TECHNICAL FIELD

Embodiments of the disclosure are directed to gas distribution plates for semiconductor processing chambers. In particular, embodiments of the disclosure are directed to remote capacitively coupled plasma (RCCP) sources with biased ion filters.

BACKGROUND

Current remote capacitively coupled plasma (RCCP) sources can cause overload defects in films. This is believed to be due to ion leakage from the RCCP source. For flowable films, it is appropriate to block the ions which have high energy, and flow radicals which can react with the volatile pre-cursor. After reaction the precursor can be converted to low molecular weight polymers with low volatility, which are deposited on the wafer as a flowable film. Current processes use oxygen radicals to react with the precursor. Since oxygen radicals have a very low lifetimes and high recombination rates on the aluminum surface, an ion blocker with large holes is used to prevent oxygen radical recombination inside the holes. However, due to the large holes, a large number of oxygen and argon ions are carried to the reaction chamber along with the radicals. These ions reduce the flowability of the deposited film and also create defects. Therefore, there is a need in the art for RCCP apparatus and methods to reduce overload defects and/or reduce ion leakage.

SUMMARY

One or more embodiments of the disclosure are directed to gas distribution apparatus comprising a remote plasma source, an ion blocker and a showerhead. The remote plasma source has a faceplate and the ion blocker has a back surface facing the faceplate. The back surface and front surface of the ion blocker define a thickness of the ion blocker. The back surface of the ion blocker is spaced a distance from the faceplate to form a gap. The ion blocker includes a plurality of openings extending through the thickness of the ion blocker. The showerhead has a back surface and a front surface. The back surface of the showerhead faces and is spaced from the front surface of the ion blocker. The showerhead comprises a plurality of apertures to allow radicals from the remote plasma source to flow through the showerhead. A voltage regulator is connected to the ion blocker and the showerhead to polarize the ion blocker relative to the showerhead.

Additional embodiments of the disclosure are directed to methods of providing radicals to a processing chamber. A plasma comprising a first amount of ions and radicals is generated in a plasma cavity bounded by an ion blocker. The ion blocker is polarized to decrease ions passing through openings in the ion blocker from the first amount of ions to a second amount and generate a flow of radicals. The flow of radicals is passed through a shower head adjacent to and spaced from the ion blocker, the showerhead comprising a plurality of apertures to allow the radicals to pass through the showerhead. The ion blocker is polarized relative to the showerhead.

Further embodiments of the disclosure are directed to non-transitory computer readable medium including instructions, that, when executed by a controller of a processing chamber, cause the processing chamber to perform operations of: generating a plasma comprising a first amount of ions and radicals in a plasma cavity; polarizing an ion blocker relative to a showerhead; and providing a flow of plasma gas into a plasma cavity bounded by an ion blocker.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Embodiments of the disclosure are directed to remote capacitively coupled plasma (RCCP) sources including a biased ion blocker plate. Some embodiments allow the RCCP to operate at higher power than traditional plasma sources. Some embodiments provide an increase in radicals (e.g., oxygen radicals) for plasma processing methods. Some embodiments advantageously provide RCCP apparatus and methods to reduce defects and improve flowability in flowable film deposition processes.

In current semiconductor manufacturing processes the defect specifications are very tight, especially in front-end-of-line (FEOL) processes. According to some embodiments, an RCCP source with a biased ion blocker is employed to prevent ions from leaking from the RCCP source to damage the film. The inventors have surprisingly found that film defects are formed substantially only by remote argon plasma and precursor flowing in the chamber. One or more embodiments of the disclosure advantageously provide apparatus and methods to reduce or eliminate defect formation in flowable films.

Figure 1:
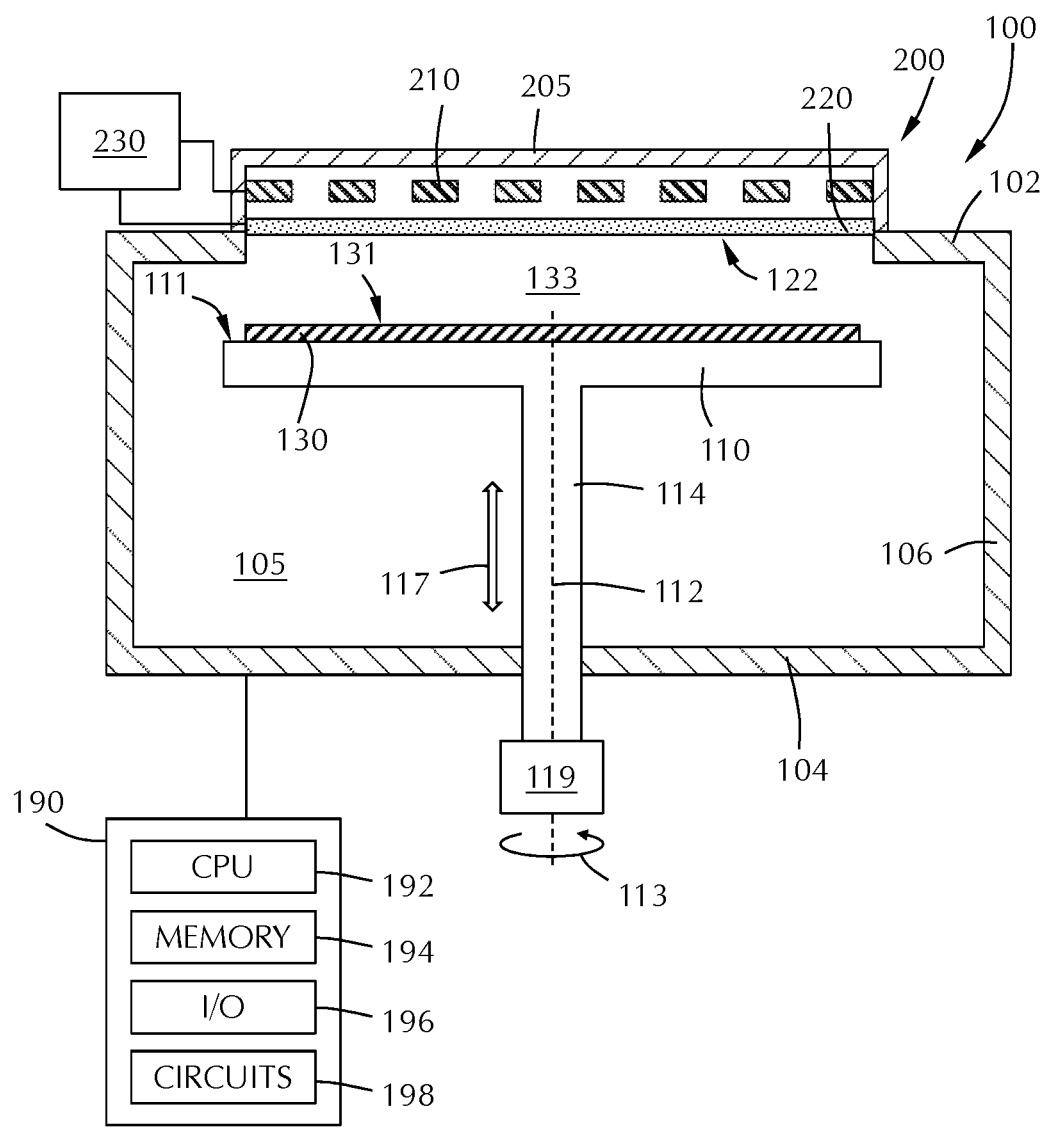
FIG. 1 shows a cross-sectional schematic view of a processing chamber in accordance with one or more embodiment of the disclosure.

With reference to FIG. 1, one or more embodiments of the disclosure are directed to processing chambers 100 including gas distribution apparatus 200 with polarizable ion blocker 210. The processing chamber 100 comprises a top 102, bottom 104 and at least one sidewall 106 enclosing an interior volume 105. The gas distribution apparatus 200 includes a showerhead 220 with a front surface 222.

A substrate support 110 is in the interior volume 105 of the processing chamber 100. The substrate support 110 of some embodiments is connected to a support shaft 114. The support shaft 114 can be integrally formed with the substrate support 110 or can be a separate component than the substrate support 100. The support shaft 114 of some embodiments is configured to rotate 113 around a central axis 112 of the substrate support 110. The illustrated embodiment includes a substrate 130 on the support surface 111 of the substrate support 110. The substrate 130 has a substrate surface 131 that faces the front surface 222 of the showerhead 220. The space between the support surface 111 and front surface 222 of the showerhead may be referred to as a reaction space 133.

In some embodiments, the support shaft 114 is configured to move 117 the support surface 111 closer to or further away from the front surface 222 of the showerhead 220. To rotate 113 or move 117 the support surface 111, the processing chamber of some embodiments includes one or more motors 119 configured for one or more of rotational or translational movement. While a single motor 119 is illustrated in FIG. 1, the skilled artisan will be familiar with suitable motors and suitable arrangements of components to execute the rotational or translational movements.

The gas distribution apparatus 200 comprises a remote plasma source 205. Generally, a remote plasma source 205 generates a plasma in a cavity or chamber located at a distance from the reaction space 133. The plasma generated in the remote plasma source 205 is transported to the reaction space 133 through a suitable connection. For example, the plasma generated in the remote plasma source 205 can flow through a showerhead into the reaction space 133.

Figure 2:
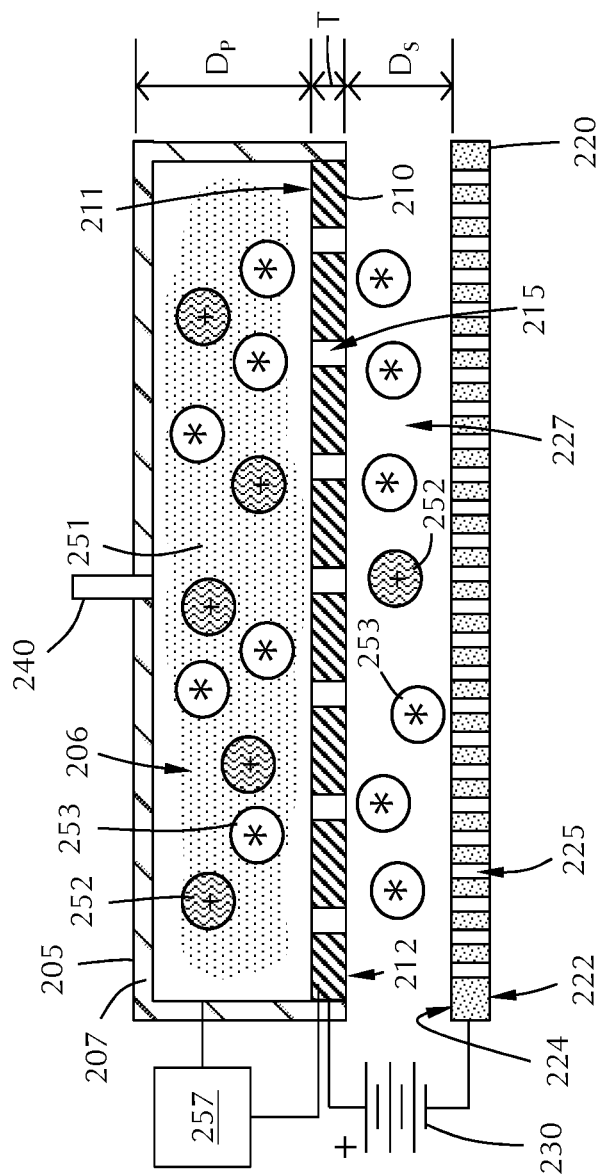
FIG. 2 shows a cross-sectional schematic view of a gas distribution apparatus according to one or more embodiment of the disclosure.
Figure 3:
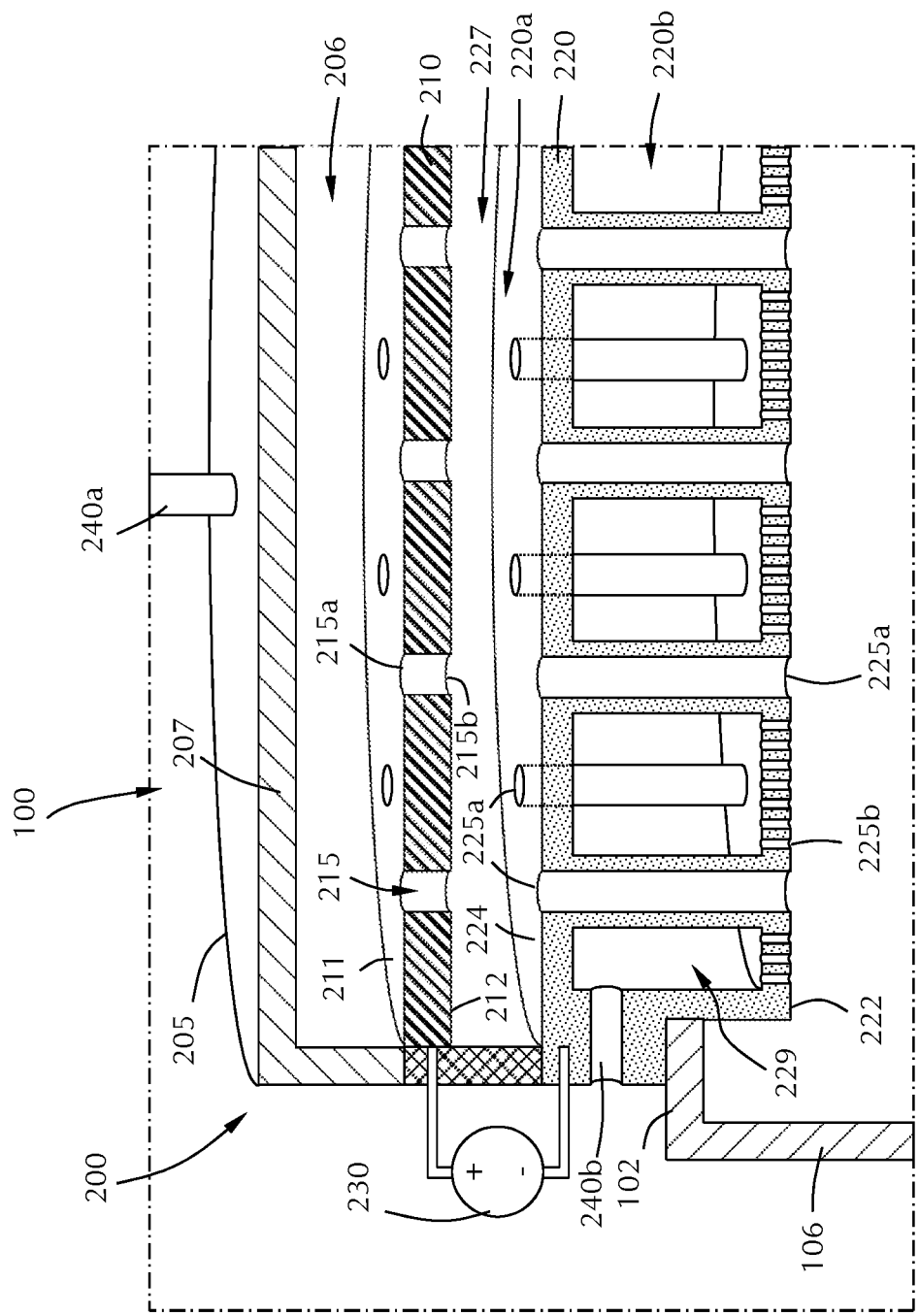
FIG. 3 illustrates a partial view of a processing chamber with a dual channel showerhead in accordance with one or more embodiment of the disclosure.

FIG. 2 illustrates a schematic view of a remote plasma source 205 in accordance with one or more embodiment of the disclosure. FIG. 3 shows a partial view of a processing chamber 100 including the gas distribution assembly 200 according to one or more embodiment of the disclosure.

Referring to both FIGS. 2 and 3, the remote plasma source 205 includes a faceplate 207 and an ion blocker 210. The faceplate 207 and ion blocker 210 enclose a plasma generation region 206, also referred to as a plasma cavity. The faceplate of the remote plasma source faces the plasma generation region 206.

The ion blocker 210 has a back surface 211 facing the faceplate 207 and bounding the plasma generation region 206, and a front surface 212. The back surface 211 is spaced a distance $D_P$ which defines a height of the plasma generation region 206. The back surface 211 and front surface 212 define a thickness T of the ion blocker 210. The ion blocker 210 includes a plurality of openings 215 extending through the thickness T so that an opening 215a is formed in the back surface 211 and an opening 215b is formed in the front surface 212. The openings 215 allow a gas to flow from the plasma generation region 206 to a region outside of the plasma generation region 206.

The gas distribution apparatus 200 includes a showerhead 220 spaced a distance from the ion blocker 210 to form a gap 227. The showerhead 220 has a front surface 222 and a back surface 224. The back surface 224 of the showerhead 220 faces the front surface 212 of the ion blocker 210. The distance between the back surface 224 of the showerhead 220 and the front surface 212 of the ion blocker 210 define a gap 227 having a distance $D_S$.

The showerhead 220 includes a plurality of apertures 225 extending from the back surface 224 to the front surface 222 to allow plasma components (e.g., radicals) to flow through the showerhead 220. The aperture openings 225a in the back surface 224 extend through the showerhead 220 to an aperture openings 225b in the front surface 222 to create the aperture 225. The aperture 225 acts as a passage to allow fluid communication between the gap 227 and the reaction space 133.

The showerhead 220 illustrated in FIG. 2 may be referred to as a single channel showerhead. To pass through the showerhead 220, a gas must flow through the apertures 225, creating a single flow path. The skilled artisan will recognize that this is merely one possible configuration, and should not be taken as limiting the scope of the disclosure. For example, the showerhead 220 illustrated in FIG. 3 is a dual channel showerhead in which there are two separate flow paths for a species to pass through the showerhead so that the species do not mix until emerging from the showerhead into the reaction space 133.

The gas distribution apparatus 200 of some embodiments includes a voltage regulator 230 connected to the ion blocker 210 and the showerhead 220. The voltage regulator 230 can be any suitable component known to the skilled artisan that can create a voltage differential between the ion blocker 210 and the showerhead 220 including, but not limited to, potentiostats. The voltage regulator 230 is connected to the ion blocker 210 and showerhead 220 by any suitable connectors known to the skilled artisan, including but not limited to, a coaxial connection in which one of the inner conductor or outer conductor is connected to the ion blocker 210 and the other of the inner conductor or outer conductor is connected to the showerhead 220. The inner conductor and outer conductor of a coaxial transmission line are electrically isolated from each other by a suitable insulator.

The gas distribution apparatus 200 includes at least one gas inlet 240. In the embodiment illustrated in FIG. 2, in which a single channel showerhead is used, the gas inlet 240 is in fluid communication with the plasma generation region 206. The plasma generation region 206 can be used for both plasma and non-plasma gases. For example, the plasma gas (gas to become a plasma) can be flowed into the plasma generation region, ignited into a plasma, and flow into the reaction space 133. After a plasma exposure, a non-plasma gas may be flowed through the plasma generation region without igniting a plasma to allow the non-plasma based species to enter the reaction space 133. In some embodiments, the processing chamber has a gas inlet in the body of the chamber (e.g., the sidewall, top or bottom) and a gas inlet in the remote plasma source.

In some embodiments, radicals are provided to the processing chamber using the ion blocker 210 to decrease the amount of ions present in the plasma from reaching the reaction space 133. Referring to FIG. 2, in some embodiments, a plasma 251 is generated in the plasma cavity (plasma generation region 206) using a power source 257. The plasma 251 has a first amount of ions 252 and a first amount of radicals 253. The embodiment illustrated in FIG. 2 shows five ions as a first amount of ions 252 in the plasma 251 and one ion as a second amount of ions 252 in the gap 227 after passing through the ion blocker 210. The skilled artisan will recognize that this Figure is used to illustrate the operation of one or more embodiment and does not reflect the ratio of ions "filtered" by the ion blocker.

The plasma 251 can be generated by any suitable technique known to the skilled artisan including, but not limited to, capacitively coupled plasma, inductively coupled plasma and microwave plasma. In some embodiments, the plasma 251 is a capacitively coupled plasma generated in the plasma cavity (plasma generation region 206) by applying RF and/or DC power to create a differential between the faceplate 207 and one or more of the ion blocker 210 or showerhead 220.

The plasma generated in the remote plasma source 105 can include any suitable reactive gases in which radicals, rather than ions, are used for reaction. In some embodiments, the plasma gas comprises one or more of molecular oxygen ($O_2$), molecular nitrogen ($N_2$), helium (He), molecular hydrogen ($H_2$), neon (Ne), argon (Ar) or krypton (Kr).

The ion blocker 210 is polarized to prevent or minimize the quantity of ions from the plasma from passing through openings 215. Polarizing the ion blocker 210 decreases the ions 252 passing through the openings 215 form the first amount to a second amount that is less than the first amount. The ion blocker 210 generates a flow of radicals 253 that, according to some embodiments, is substantially free of ions 252. As used in this manner, the term "substantially free of ions" means that the ion composition entering the reaction space 133 is less than or equal to about 10%, 5%, 2%, 1%, 0.5% or 0.1% of the quantity of radicals entering the reaction space 133.

The ion blocker 210 of some embodiments decreases the number of ions 252 in the plasma 251 from a first number in the plasma generation region 206 to a second number in the reaction space 133 or the gap 227. In some embodiments, the second number is less than or equal to about 50%, 40%, 30%, 20%, 10%, 5%, 2%, 1% or 0.5% of the first number.

Because the ions 252 are charged, the polarized ion blocker 210 acts as a barrier to ion 252 passage through the openings 215. Whereas the radicals 253 are uncharged, the polarized ion blocker 210 has a minimal, if any, impact on the movement of the radicals through the openings 215 so that the radicals 253 can pass through the ion blocker 210. The radicals 253 can then pass through openings 225 in the showerhead 220 and into the reaction space 133.

The ion blocker 210 can be made of any suitable material having any suitable thickness. In some embodiments, the ion blocker 210 comprises aluminum or stainless steel. In some embodiments, the ion blocker 210 has a thickness T in the range of about 0.5 mm to about 50 mm, or in the range of about 1 mm to about 25 mm, or in the range of about 2 mm to about 20 mm, or in the range of about 3 mm to about 15 mm, or in the range of about 4 mm to about 10 mm.

The openings 215 in the ion blocker 210 can have a uniform width or can be varied in width. In some embodiments, the openings 215 have diameters that vary depending on location within the ion blocker 210. For example, in some embodiments, the openings 215 in the ion blocker 210 may be larger around the outer peripheral edge of the ion blocker 210 than the openings in the center of the ion blocker 210. In some embodiments, the width (or diameter for a circular opening) of any given opening 215 varies through the thickness T of the ion blocker 210. For example, in some embodiments, the width (or diameter for a circular opening) of the opening 215a is greatest on the back surface 211 tapering down to a smaller width (or diameter for a circular opening) of the openings 215b in the front surface 212 of the ion blocker 210. In some embodiments, the openings 215 are circular and have a diameter in the range of about ⅛" to about ½", or in the range of about 3/16" to about 7/16", or in the range of about ¼" to about ⅜", or about 5/16". In some embodiments, the openings 215 are circular and have a diameter in the range of about 3 mm to about 13 mm, or in the range of about 4 mm to about 12 mm, or in the range of about 5 mm to about 11 mm, or in the range of about 6 mm to about 10 mm, or in the range of about 7 mm to about 9 mm, or about 8 mm.

In some embodiments, the ion blocker 210 is polarized relative to the showerhead 220 using a voltage regulator 230. In some embodiments, the voltage regulator is configured to provide a direct current (DC) polarization of the ion blocker 210 relative to the showerhead 220 in the range of about ±2V to about ±100V, or in the range of about ±5V to about ±50V. Stated differently, the ion blocker 210 is polarized relative to the showerhead 220 in the range of about 2V to about 100V, or in the range of about 5V to about 50V, with either a position or negative bias.

Referring to FIG. 3, some embodiments of the disclosure have a dual channel showerhead 220. The dual channel showerhead 220 has a first gas channel 220a and a second gas channel 220b. The first gas channel 220a acts as a first gas flow path to allow a first gas in gap 227 to pass through the showerhead 220 to the reaction space 133. The second gas channel 220b acts as a second gas flow path to allow a second gas to flow into the reaction space 133 without mixing with the first gas. In the illustrated embodiment, there are two gas inlets 240a, 240b, one connected to the plasma generation region 206 of the remote plasma source 205, the other bypassing the remote plasma source 205 and coupled directly to the second gas channel 220b.

In the illustrated embodiment, the first gas channel 220a of the dual channel showerhead 220 is in fluid communication with the gap 227 between the ion blocker 210 and the faceplate 207 so that the plurality of apertures 225 in the showerhead 220 comprises a first plurality of apertures 225a that extend from the front surface 222 to the back surface 224 of the showerhead 220. The gap 227 can act as a plenum for the gas from the remote plasma source 205 to provide a uniform gas flow to the reaction space 133.

In some embodiments, the second gas channel 220b of the dual channel showerhead 220 is in fluid communication with a second plurality of apertures 225b. The second plurality of apertures 225a extends from the front surface 222 of the showerhead 220 to a gas volume 229. The gas volume 229 can act as a plenum between the gas inlet 240b and the reaction space 133 so that a second gas can flow to the reaction space without passing through the gap 227 or coming into contact with the first gas until both the first gas and second gas are in the reaction space 133. Stated differently, the second plurality of apertures 225b does not directly connect the second gas channel with the back surface 224 of the showerhead 220. As used in this manner, the term "does not directly connect" means that a gas flowing through the second plurality of apertures 225b does not come into contact with the back surface 224 of the showerhead 220 without passing through one of the first plurality of apertures 225a.

In some embodiments, at least some of the openings 215 in the ion blocker 210 are aligned with at least some of the first plurality of openings 225a in the showerhead 220. As used in this manner, the term "aligned" means that an imaginary line drawn through the center of the opening 215 extending from back surface 211 to front surface 212 would also pass through an opening 225a in the showerhead 220. In the illustrated embodiment of FIG. 3, each of the openings 215 in the ion blocker 210 are aligned with one of the first plurality of openings 225a to provide a more direct flow path from the plasma generation region 206 to the reaction space 133 while passing through the ion blocker 210. In some embodiments, none of the openings 215 in the ion blocker 210 are aligned directly with one of the first plurality of openings 225a.

Referring back to FIG. 1, some embodiments of the processing chamber 100 include at least one controller 190 coupled to one or more of the processing chamber 100, substrate support 110, support shaft 114, motor 119, remote plasma source 205, ion blocker 210 or voltage regulator 230. In some embodiments, there are more than one controller 190 connected to the individual components and a primary control processor is coupled to each of the separate controller or processors to control the system. The controller 190 may be one of any form of general-purpose computer processor, microcontroller, microprocessor, etc., that can be used in an industrial setting for controlling various chambers and sub-processors.

The at least one controller 190 can have a processor 192, a memory 194 coupled to the processor 192, input/output devices 196 coupled to the processor 192, and support circuits 198 to communication between the different electronic components. The memory 194 can include one or more of transitory memory (e.g., random access memory) and non-transitory memory (e.g., storage).

The memory 194, or a computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform embodiments of the disclosure. The controller 190 can be connected to and configured to operate intermediate components to perform the functions of the methods. For example, the controller 190 can be connected to and configured to control one or more of gas valves, actuators, motors, slit valves, vacuum control, etc.

The controller 190 or non-transitory computer readable medium of some embodiments has one or more configurations or instructions selected from a configuration to: rotate the substrate support around a central axis; provide a flow of gas into the remote plasma source; generate a plasma in the remote plasma source; provide a voltage differential between the ion blocker and the showerhead; or provide a flow of a second gas to a second channel of the showerhead.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution apparatus comprising:
   a remote plasma source having a faceplate;
   an ion blocker having a back surface facing the faceplate and a front surface defining a thickness, the back surface of the ion blocker spaced a distance from the faceplate to form a gap, the ion blocker comprising a plurality of openings extending through the thickness;
   a showerhead having a back surface and a front surface, the back surface of the showerhead facing and spaced from the front surface of the ion blocker, the showerhead comprising a plurality of apertures to allow radicals from the remote plasma source to flow through the showerhead; and
   a voltage regulator connected to the ion blocker and the showerhead to polarize the ion blocker relative to the showerhead;
   wherein the ion blocker is polarized relative to the showerhead so that there are substantially no plasma gas ions passing through the showerhead.

2. The gas distribution apparatus of claim 1, wherein the showerhead is a dual channel showerhead having a first gas channel and a second gas channel.

3. The gas distribution apparatus of claim 2, wherein the first gas channel of the dual channel showerhead is in fluid communication with the gap between the ion blocker and the faceplate so that the plurality of apertures in the showerhead comprises a first plurality of apertures that extend from the front surface to the back surface of the showerhead.

4. The gas distribution apparatus of claim 3, wherein the second gas channel of the dual channel showerhead is in fluid communication with a second plurality of apertures in the front surface of the showerhead and none of the second plurality of apertures directly connects the second gas channel with the back surface of the showerhead.

5. The gas distribution apparatus of claim 3, wherein at least some of the openings in the ion blocker are aligned with at least some of the first plurality of openings in the showerhead.

6. The gas distribution apparatus of claim 3, wherein each of the openings in the ion blocker are aligned with one of the first plurality of openings in the showerhead.

7. The gas distribution apparatus of claim 1, wherein voltage regulator is configured to provide a direct current (DC) polarization of the ion blocker relative to the showerhead in the range of about ±2V to about ±100V.

8. The gas distribution apparatus of claim 1, wherein the voltage regulator is configured to provide a direct current (DC) polarization of the ion blocker relative to the showerhead in the range of about ±5V to about ±50V.

9. The gas distribution apparatus of claim 1, wherein the openings in the ion blocker have a diameter in the range of about 1/8" to about 1/2".

10. A processing chamber comprising the gas distribution apparatus of claim 1.

11. The processing chamber of claim 10, further comprising a substrate support having a support surface facing the front surface of the showerhead.

12. The processing chamber of claim 11, further comprising a controller having one or more configurations selected from a configuration to: rotate the substrate support around a central axis; provide a flow of gas into the remote plasma source; generate a plasma in the remote plasma source; provide a voltage differential between the ion blocker and the showerhead.

13. A method of providing radicals to a processing chamber, the method comprising:
generating a plasma comprising a first amount of ions and radicals in a plasma cavity bounded by an ion blocker;
polarizing the ion blocker to decrease ions passing through openings in the ion blocker from the first amount of ions to a second amount and generate a flow of radicals; and
passing the flow of radicals through a shower head adjacent to and spaced from the ion blocker, the showerhead comprising a plurality of apertures to allow the radicals to pass through the showerhead,
wherein the ion blocker is polarized relative to the showerhead so that there are substantially no plasma gas ions passing through the showerhead.

14. The method of claim 13, wherein the plasma gas comprises one or more of oxygen ($O_2$) or argon (Ar).

15. The method of claim 13, wherein the ion blocker is polarized relative to the showerhead so that there are substantially no plasma gas ions passing through the showerhead.

16. The method of claim 13, wherein the ion blocker is polarized with a voltage regulator configured to provide a direct current (DC) polarization of the ion blocker relative to the showerhead in the range of about ±2V to about ±100V.

17. The gas distribution apparatus of claim 1, wherein the voltage regulator is configured to provide a direct current (DC) polarization of the ion blocker relative to the showerhead in the range of about ±5V to about ±50V.

18. The method of claim 13, wherein the openings in the ion blocker have a diameter in the range of about 1/8" to about 1/2".

19. A non-transitory computer readable medium including instructions, that, when executed by a controller of a processing chamber, cause the processing chamber to perform operations of:
generating a plasma comprising a first amount of ions and radicals in a plasma cavity;
polarizing an ion blocker relative to a showerhead so that there are substantially no plasma gas ions passing through the showerhead; and
providing a flow of plasma gas into a plasma cavity bounded by an ion blocker.

\* \* \* \* \*